US012674842B2

(12) United States Patent
Kang et al.

(10) Patent No.: US 12,674,842 B2
(45) Date of Patent: Jul. 7, 2026

(54) BATTERY MANAGEMENT DEVICE, BATTERY MANAGEMENT METHOD, AND BATTERY CHARGE AND DISCHARGE SYSTEM

(71) Applicant: LG Energy Solution, Ltd., Seoul (KR)

(72) Inventors: Ju Young Kang, Daejeon (KR); Heung Il Park, Daejeon (KR); Da Jin Lee, Daejeon (KR); In Hwan Cho, Daejeon (KR); Jung Oh Seo, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 193 days.

(21) Appl. No.: 18/746,245

(22) Filed: Jun. 18, 2024

(65) Prior Publication Data

US 2025/0012861 A1     Jan. 9, 2025

(30) Foreign Application Priority Data

Jul. 5, 2023     (KR) ......................... 10-2023-0087340
May 14, 2024     (KR) ......................... 10-2024-0063112

(51) Int. Cl.
*G01R 31/367* (2019.01)
*G01R 19/165* (2006.01)
(Continued)

(52) U.S. Cl.
CPC ....... *G01R 31/367* (2019.01); *G01R 31/3835* (2019.01); *H01M 10/425* (2013.01); *H01M 10/44* (2013.01); *H01M 10/46* (2013.01); *H01M 2010/4271* (2013.01)

(58) Field of Classification Search
CPC .... G01R 31/36; G01R 31/367; G01R 31/385; G01R 31/3835; G01R 31/3842;
(Continued)

(56) References Cited

U.S. PATENT DOCUMENTS

2020/0025832 A1     1/2020 Cho et al.
2021/0247446 A1* 8/2021 Lim ................... H01M 10/486
(Continued)

FOREIGN PATENT DOCUMENTS

JP          6201395 B2      9/2017
KR      2000-0021899 A      4/2000
(Continued)

OTHER PUBLICATIONS

International Search Report for PCT/KR2024/006839 mailed Aug. 30, 2024. 3 pages. (see p. 2-3, categorizing the cited references).

*Primary Examiner* — Neel D Shah
(74) *Attorney, Agent, or Firm* — Lerner David LLP

(57) ABSTRACT
A battery management device includes: an interface that obtains voltage measurement values generated by measuring voltage from a battery at regular time intervals within a first time period; and a controller that: derives an average rate of change of the voltage measurement values during the first time period; compares the voltage measurement values with corresponding values according to the average rate of change to derive voltage difference values during the first time period; and determines whether an error exists in the voltage measurement values during the first time period based on the voltage difference values.

20 Claims, 11 Drawing Sheets

(51) Int. Cl.
    *G01R 19/30*       (2006.01)
    *G01R 31/3835*    (2019.01)
    *H01M 10/42*      (2006.01)
    *H01M 10/44*      (2006.01)
    *H01M 10/46*      (2006.01) .

(58) Field of Classification Search
    CPC .. G01R 31/392; G01R 31/396; G01R 19/165;
             G01R 19/30; H01M 10/42; H01M 10/44;
                                 H01M 10/46
    See application file for complete search history.

(56)                       References Cited

U.S. PATENT DOCUMENTS

| 2022/0146585 A1 | 5/2022 | Hong et al. |
| 2023/0108798 A1 | 4/2023 | Shim et al. |
| 2023/0273264 A1 | 8/2023 | Kim |
| 2023/0366938 A1 | 11/2023 | Lee |

FOREIGN PATENT DOCUMENTS

| KR | 2003-0072734 A | 9/2003 |
| KR | 100445595 B1 | 8/2004 |
| KR | 20190028941 A | 3/2019 |
| KR | 20200011014 A | 1/2020 |
| KR | 2020-0013906 A | 2/2020 |
| KR | 20210067227 A | 6/2021 |
| KR | 20220015790 A | 2/2022 |
| KR | 2022-0100442 A | 7/2022 |
| KR | 20220094464 A | 7/2022 |

* cited by examiner

100

VOLTAGE MEASUREMENT
VALUE

BATTERY MANAGEMENT
DEVICE
130

INTERFACE
131

SENSOR 131-1

COMMUNI
-CATION
UNIT
131-2

CONTROLLER
132

WHETHER ERROR
EXISTS

VOLTAGE CORRECTION
VALUE

| Time[s] | Voltage[V] | Slope | Δ_V-Slope |
|---|---|---|---|
| 1 | 3.3787 | 3.3787 | 0.0000 |
| 8.4 | 3.3777 | 3.3781 | 0.0005 |
| 16.6 | 3.3766 | 3.3776 | 0.0010 |
| 25.2 | 3.3756 | 3.3770 | 0.0014 |
| 29.1 | 3.3752 | 3.3768 | 0.0016 |
| 33.2 | 3.3746 | 3.3765 | 0.0019 |
| 40.9 | 3.3736 | 3.3760 | 0.0024 |
| 49.4 | 3.3725 | 3.3754 | 0.0029 |
| 57.3 | 3.3715 | 3.3749 | 0.0034 |
| 59 | 3.3730 | 3.3748 | 0.0018 |
| 59.1 | 3.3767 | 3.3748 | -0.0019 |
| 59.2 | 3.3808 | 3.3748 | -0.0060 |
| 59.3 | 3.3820 | 3.3748 | -0.0072 |
| 59.6 | 3.3830 | 3.3748 | -0.0083 |
| 60.2 | 3.3841 | 3.3747 | -0.0093 |
| 64.4 | 3.3830 | 3.3744 | -0.0086 |
| 64.6 | 3.3805 | 3.3744 | -0.0060 |
| 64.7 | 3.3784 | 3.3744 | -0.0040 |
| 64.8 | 3.3772 | 3.3744 | -0.0028 |
| 65.5 | 3.3762 | 3.3744 | -0.0018 |
| 80 | 3.3752 | 3.3734 | -0.0017 |
| 87.1 | 3.3741 | 3.3729 | -0.0012 |
| 89.1 | 3.3741 | 3.3728 | -0.0012 |
| 93.4 | 3.3731 | 3.3725 | -0.0006 |
| 100.6 | 3.3720 | 3.3720 | 0.0000 |

| Time[s] | Voltage[V] | Slope | Δ V-Slope |
|---|---|---|---|
| 1 | 3.5592 | 3.5592 | 0.0000 |
| 1.9 | 3.5603 | 3.5603 | 0.0000 |
| 2.8 | 3.5613 | 3.5608 | -0.0005 |
| 3.6 | 3.5624 | 3.5612 | -0.0012 |
| 4.6 | 3.5635 | 3.5618 | -0.0017 |
| 5.5 | 3.5645 | 3.5623 | -0.0022 |
| 6.4 | 3.5655 | 3.5628 | -0.0027 |
| 7.3 | 3.5666 | 3.5633 | -0.0033 |
| 8.4 | 3.5676 | 3.5639 | -0.0037 |
| 9.4 | 3.5686 | 3.5645 | -0.0041 |
| 10.4 | 3.5697 | 3.5651 | -0.0046 |
| 11.3 | 3.5707 | 3.5656 | -0.0051 |
| 12.3 | 3.5718 | 3.5661 | -0.0056 |
| 13.4 | 3.5729 | 3.5668 | -0.0061 |
| 14.5 | 3.5739 | 3.5674 | -0.0065 |
| 15.6 | 3.5750 | 3.5680 | -0.0070 |
| 16.7 | 3.5760 | 3.5686 | -0.0074 |
| 17.9 | 3.5771 | 3.5693 | -0.0078 |
| 19 | 3.5782 | 3.5699 | -0.0083 |
| 20.2 | 3.5793 | 3.5706 | -0.0087 |
| 21.5 | 3.5804 | 3.5714 | -0.0090 |
| 22.9 | 3.5814 | 3.5721 | -0.0093 |
| 24.2 | 3.5825 | 3.5729 | -0.0096 |
| 25.5 | 3.5836 | 3.5736 | -0.0100 |
| 26.9 | 3.5847 | 3.5744 | -0.0103 |

...

| Time[s] | Voltage[V] | Slope | Δ V-Slope |
|---|---|---|---|
| 80.4 | 3.6107 | 3.6047 | -0.0061 |
| 84 | 3.6118 | 3.6067 | -0.0051 |
| 87.5 | 3.6128 | 3.6087 | -0.0041 |
| 91.7 | 3.6138 | 3.6111 | -0.0026 |
| 95.8 | 3.6149 | 3.6134 | -0.0015 |
| 100.2 | 3.6159 | 3.6159 | 0.0000 |

710

711

720

V

—— Voltage[V]    --- Slope

910

| Time[s] | Voltage[V] | Slope | Δ V-Slope | |
|---|---|---|---|---|
| 1 | 2.7721 | 2.7721 | 0.0000 | |
| 5.1 | 2.7731 | 2.7731 | 0.0000 | |
| 9.5 | 2.7741 | 2.7739 | -0.0002 | |
| 13.9 | 2.7751 | 2.7748 | -0.0003 | |
| 18.3 | 2.7761 | 2.7757 | -0.0005 | |
| 22.9 | 2.7771 | 2.7766 | -0.0006 | |
| 27.7 | 2.7782 | 2.7775 | -0.0007 | |
| 29.4 | 2.7785 | 2.7778 | -0.0007 | |
| 32.5 | 2.7792 | 2.7784 | -0.0007 | |
| 37.3 | 2.7802 | 2.7794 | -0.0008 | |
| 43.4 | 2.7812 | 2.7806 | -0.0007 | |
| 48.5 | 2.7823 | 2.7816 | -0.0007 | |
| 51.7 | 2.7834 | 2.7822 | -0.0011 | |
| 52.7 | 2.7874 | 2.7824 | -0.0050 | ← 911 |
| 52.8 | 2.7832 | 2.7824 | -0.0008 | ← 912 |
| 54.5 | 2.7958 | 2.7828 | -0.0151 | ← 913 |
| 54.6 | 2.7919 | 2.7828 | -0.0091 | |
| 54.7 | 2.7835 | 2.7828 | -0.0007 | |
| 60 | 2.7846 | 2.7838 | -0.0007 | |
| 61 | 2.7892 | 2.7844 | -0.0048 | ← 914 |
| 63.1 | 2.7852 | 2.7845 | -0.0007 | |
| 63.9 | 2.7934 | 2.7846 | -0.0087 | ← 915 |
| 64 | 2.7897 | 2.7846 | -0.0051 | ← 916 |
| 64.1 | 2.7853 | 2.7847 | -0.0006 | |
| 64.8 | 2.7948 | 2.7848 | -0.0100 | ← 917 |
| 64.9 | 2.7855 | 2.7848 | -0.0007 | |
| 65.9 | 2.7874 | 2.7850 | -0.0024 | ← 918 |
| 66 | 2.7857 | 2.7850 | -0.0007 | |
| 69.8 | 2.7871 | 2.7858 | -0.0014 | |
| 79.4 | 2.7882 | 2.7877 | -0.0005 | |
| 85 | 2.7892 | 2.7888 | -0.0004 | |
| 89.4 | 2.7900 | 2.7896 | -0.0003 | |
| 91.1 | 2.7902 | 2.7900 | -0.0002 | |
| 96.4 | 2.7912 | 2.7910 | -0.0002 | |
| 102.8 | 2.7923 | 2.7923 | 0.0000 | |

FIG. 10

| Time[s] | Voltage[V] | Slope | Δ V-Slope | |
|---|---|---|---|---|
| 1 | 3.7497 | 3.7497 | 0.0000 | |
| 10.4 | 3.7487 | 3.7486 | -0.0001 | |
| 19.4 | 3.7477 | 3.7477 | -0.0001 | |
| 26.1 | 3.7470 | 3.7470 | -0.0001 | |
| 29.2 | 3.7467 | 3.7466 | -0.0001 | |
| 37.8 | 3.7457 | 3.7457 | 0.0000 | |
| 44.4 | 3.7489 | 3.7450 | -0.0039 | 1011 |
| 44.5 | 3.7451 | 3.7450 | -0.0001 | |
| 53.8 | 3.7441 | 3.7440 | 0.0000 | |
| 62.8 | 3.7430 | 3.7431 | 0.0000 | |
| 64.5 | 3.7441 | 3.7429 | -0.0012 | 1012 |
| 64.8 | 3.7454 | 3.7428 | -0.0026 | 1013 |
| 65.2 | 3.7472 | 3.7428 | -0.0044 | 1014 |
| 65.6 | 3.7483 | 3.7428 | -0.0055 | 1015 |
| 65.7 | 3.7428 | 3.7428 | -0.0001 | |
| 69.5 | 3.7444 | 3.7423 | -0.0020 | 1016 |
| 69.8 | 3.7424 | 3.7423 | -0.0001 | |
| 74.5 | 3.7442 | 3.7418 | -0.0023 | 1017 |
| 75.4 | 3.7417 | 3.7417 | 0.0000 | |
| 84.4 | 3.7407 | 3.7408 | 0.0001 | |
| 86.1 | 3.7406 | 3.7406 | -0.0001 | |
| 94.3 | 3.7397 | 3.7397 | 0.0000 | |
| 104.1 | 3.7387 | 3.7387 | 0.0000 | |

1100

BATTERY MANAGEMENT DEVICE, BATTERY MANAGEMENT METHOD, AND BATTERY CHARGE AND DISCHARGE SYSTEM

CROSS-REFERENCE TO RELATED APPLICATIONS

This application is based on and claims priority from Korean Patent Application No. 10-2023-0087340 filed on Jul. 5, 2023 with the Korean Intellectual Property Office, and Korean Patent Application No. 10-2024-0063112 filed on May 14, 2024 with the Korean Intellectual Property Office, the disclosure of which is incorporated herein in its entirety by reference.

TECHNICAL FIELD

Embodiments disclosed herein relate to a battery management device, a battery management method, and a battery charge and discharge system.

BACKGROUND

Research and development on secondary batteries have been conducted actively in recent years. Here, the term secondary batteries stand for batteries that can be charged and discharged, and may be interpreted as encompassing both conventional batteries such as Ni/Cd batteries and Ni/MH batteries and lithium ion batteries. Among the secondary batteries, compared to the conventional batteries such as Ni/Cd batteries and Ni/MH batteries, the lithium-ion batteries may have a relatively higher energy density and may be manufactured in a small and lightweight form to have high usability in terms of power sources for mobile devices. Recently, the lithium-ion batteries have expanded their range of use as a power source for electric vehicles and are attracting attention as a next-generation energy storage medium.

Meanwhile, various methods are being attempted to reliably evaluate the performance and problems of these secondary batteries, including lithium-ion batteries.

SUMMARY

A battery management device, a battery management method, and a battery charge and discharge system disclosed herein have been conceived to correct voltage measurement values so as to solve the problem of not being able to distinguish between true defects and false defects of batteries, which is one of the problems in battery charge and discharge tests.

Meanwhile, embodiments disclosed herein are not limited to the above-mentioned technical problems, and other technical problems not mentioned above will be clearly understood by a person ordinarily skilled in the art from the description below.

According to an embodiment of the present disclosure, a battery management device includes: an interface that obtains voltage measurement values generated by measuring voltage from a battery at regular time intervals within a first time period; and a controller that: derives an average rate of change of the voltage measurement values during the first time period; compares the voltage measurement values with corresponding values according to the average rate of change to derive voltage difference values during the first time period; and determines whether an error exists in the voltage measurement values during the first time period based on the voltage difference values.

According to the embodiment, the controller derives voltage correction values for the first time period by correcting the voltage measurement values based on the voltage difference values when it is determined that the error exists in the voltage measurement values.

According to the embodiment, the controller determines whether a first error, which occurs in a process of generating the voltage measurement values based on the voltage difference values, exists; and corrects the voltage measurement values based on whether the first error exists.

According to the embodiment, the first error includes an error occurring in a charge/discharge device that charges or discharges the battery for a charge and discharge test and an error that occurs in the process of measuring the voltage of the battery to generate the voltage measurement values.

According to the embodiment, the controller determines whether the first error exists based on signs of the voltage difference values, whether the voltage difference values exceed a threshold difference value, and whether the voltage difference values recover to a range where the voltage difference values do not exceed the threshold difference value within a second time period after exceeding the threshold difference value.

According to the embodiment, the controller determines that the first error exists when the voltage difference values have a negative sign, the voltage difference values exceed the threshold difference value, and the voltage difference values recover within the second time period after the first time period.

According to the embodiment, the controller determines that the first error does not exist and a second error, which occurs due to a defect of the battery, exists when the voltage difference values include both positive and negative signs, and the voltage difference values exceed the threshold difference value.

According to the embodiment, the controller determines that neither the first error nor the second error, which occurs due to a defect in the battery, exists when the voltage difference values exceed the threshold difference value, and the voltage difference values do not recover within the second time period.

According to the embodiment disclosed herein, a battery management method includes: obtaining, via an interface, voltage measurement values generated by measuring voltage from a battery; deriving, via a controller, an average rate of change of the voltage measurement values during the first time period; comparing, via the controller, the voltage measurement values with corresponding values according to the average rate of change to derive voltage difference values during the first time period; and determining, via the controller, whether an error exists in the voltage measurement values during the first time period based on the voltage difference values.

According to the embodiment, the battery management method further includes deriving voltage correction values for the first time period by correcting the voltage measurement values based on the voltage difference values when it is determined via the controller that the error exists in the voltage measurement values.

According to the embodiment, the deriving the voltage correction values includes: determining whether a first error, which occurs in a process of generating the voltage measurement values based on the voltage difference values, exists; and correcting the voltage measurement values based on whether the first error exists.

According to the embodiment, the first error includes an error occurring in a charge/discharge device that charges or discharges the battery for a charge and discharge test and an error that occurs in the process of measuring the voltage of the battery to generate the voltage measurement values.

According to the embodiment, the determining whether the first error exists includes determining whether the first error exists based on signs of the voltage difference values, whether the voltage difference values exceed a threshold difference value, and whether the voltage difference values recover to a range where the voltage difference values do not exceed the threshold difference value within a second time period after exceeding the threshold difference value.

According to the embodiment, the determining whether the first error exists includes determining that the first error exists when the voltage difference values have a negative sign, the voltage difference values exceed the threshold difference value, and the voltage difference values recover within the second time period after the first time period.

According to the embodiment, the determining whether the first error exists includes determining that the first error does not exist and a second error, which occurs due to a defect of the battery, exists when the voltage difference values include both positive and negative signs, and the voltage difference values exceed the threshold difference value.

According to the embodiment, the determining whether the first error exists includes the step of determining that neither the first error nor a second error, which occurs due to a defect in the battery, exists when the voltage difference values exceed the threshold difference value and the voltage difference values do not recover within the second time period.

According to the embodiment disclosed herein, a battery charge and discharge system includes: a battery; a charge/discharge device charges or discharges the battery for a charge and discharge test; and a battery management device that: obtains voltage measurement values generated by measuring voltage from the battery during a first time period; derive an average rate of change of the voltage measurement values during the first time period; compares the voltage measurement values with corresponding values according to the average rate of change to derive voltage difference values during the first time period; and determines whether an error exists in the voltage measurement values during the first time period based on the voltage difference values.

According to the embodiment, the battery management device derives voltage correction values for the first time period by correcting the voltage measurement values based on the voltage difference values when it is determined that the error exists in the voltage measurement values.

According to the embodiment, the battery management device determines whether a first error, which occurs in a process of generating the voltage measurement values based on the voltage difference values, exists; and corrects the voltage measurement values based on whether the first error exists.

According to the embodiment, the first error includes an error occurring in a charge/discharge device that charges or discharges the battery for the charge and discharge test and an error that occurs in the process of measuring the voltage of the battery to generate the voltage measurement values.

According to the embodiment, the battery management device determines whether the first error exists based on signs of the voltage difference values, whether the voltage difference values exceed a threshold difference value, and whether the voltage difference values recover to a range where the voltage difference values do not exceed the threshold difference value within a second time period after exceeding the threshold difference value.

According to the embodiment, the battery management device determines that the first error exists when the voltage difference values have a negative sign, the voltage difference values exceed the threshold difference value, and the voltage difference values recover within the second time period after the first time period.

According to the embodiment, the battery management device determines that the first error does not exist and a second error, which occurs due to a defect of the battery, exists when the voltage difference values include both positive and negative signs, and the voltage difference values exceed the threshold difference value.

According to the embodiment, the battery management device determines that neither the first error nor the second error, which occurs due to a defect in the battery, exists when the voltage difference values exceed the threshold difference value and the voltage difference values do not recover within the second time period.

According to the embodiments disclosed herein, it is possible to provide a battery management device, a battery management method, and a battery charge and discharge system capable of correcting voltage measurement values to distinguish between true defects and false defects.

The technical effects according to the embodiments disclosed herein are not limited to the above-mentioned effects, and other effects not mentioned above will be clearly understood by a person ordinarily skilled in the art according to the disclosure of this document.

BRIEF DESCRIPTION OF THE DRAWINGS

FIGS. 8 to 10 are views each illustrating a process of determining that the first error has occurred based on voltage measurement values according to the embodiment.

Figure 1:
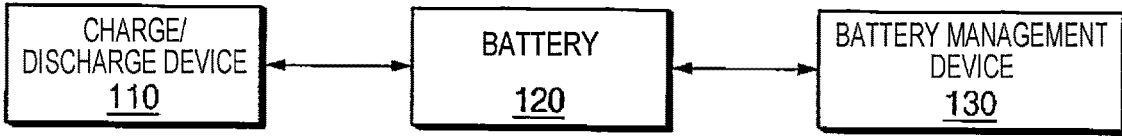
FIG. 1 is a view illustrating elements of a battery charge and discharge system according to an embodiment.

In the accompanying drawings, corresponding components are given the same reference numerals. A person ordinarily skilled in the art will appreciate that the drawings illustrate elements simply and clearly and are not necessarily drawn to scale. For example, in order to aid understanding of various embodiments, the dimensions of some elements illustrated in the drawings may be exaggerated compared to other elements. In addition, elements that are useful or essential in commercially implementable embodiments but are known in the art may often not be described in order to avoid impeding the understanding of the spirit of various embodiments of the present disclosure.

DETAILED DESCRIPTION

Hereinafter, embodiments disclosed herein will be described with reference to the accompanying drawings. However, this is not intended to limit the disclosure to specific embodiments, but should be understood to include various modifications, equivalents, and/or alternatives to the embodiments disclosed herein.

The embodiments of the disclosure and the terms used herein are not intended to limit the technical features disclosed herein to specific embodiments, and should be understood to include various modifications, equivalents, or substitutions for the embodiments. In connection with the descriptions made with reference to the drawings, similar or related components may be denoted by similar reference numerals. The singular form of a noun corresponding to an item may include one item or a plurality of items unless the relevant context clearly dictates otherwise.

In the disclosure, each of phrases, such as "A or B," "at least one of A and B," "at least one of A or B," "A, B, or C," "at least one of A, B, and C," and "at least one of A, B, or C" may include any one of the items listed together in the corresponding phrase or all possible combinations of the items. Terms such as "$1^{st}$," "$2^{nd}$," "first," "second," "A," "B," "(a)," and "(b)" may be used to distinguish one component from another, and the components are not limited in other respects (e.g., importance or order) unless specifically stated to the contrary.

In the disclosure, when one (e.g., a first) component is mentioned as being "connected," "coupled," or "joined" to another (e.g., a second) component, with or without the terms "functionally" or "communicatively," it means that the one component may be connected to another component directly (e.g., either with wire or wirelessly), or indirectly (e.g., via a third component).

The methods according to various embodiments disclosed herein may be included in and provided with a computer program product. The computer program product may be traded as a product between a seller and a purchaser. The computer program product may be distributed in the form of a computer-readable storage medium (e.g., compact disc read only memory (CD-ROM)), or may be distributed (e.g., downloaded or uploaded) online through an application store or directly between two user devices. In the case of online distribution, at least part of the computer program product may be temporarily stored in or temporarily produced from a computer-readable storage medium such as a manufacturer's server, a server of an application store, or memory of a relay server.

According to various embodiments disclosed herein, each of the above-described components (e.g., module or program) may include a single entity or a plurality of entities, and some of the plurality of objects may be separated and disposed in other components. According to embodiments disclosed herein, one or more of the above-described corresponding components or operations may be omitted, or one or more other components or operations may be added. Alternatively or additionally, a plurality of components (e.g., modules or programs) may be integrated into a single component. In such a case, an integrated component may perform one or more functions of each of the plurality of components in the same or a similar manner as when performed by the corresponding one of the plurality of components prior to the integration. According to embodiments disclosed herein, operations performed by a module, a program, or other components may be executed sequentially, in parallel, repetitively, or heuristically, one or more of the operations may be executed in a different order or omitted, or one or more other operations may be added thereto.

The charge and discharge tests may be conducted on various secondary batteries, including lithium secondary batteries, for various purposes such as performance diagnosis and condition analysis. For example, a test voltage may be applied to a battery, and a test result voltage may be measured from the battery in response to the test voltage. When the voltage behavior is unstable or outside a normal range during the analysis of the test result voltage, it may be determined that there is a problem with the battery. However, in addition to the true defects due to battery problems, there may be false defects in which errors in the test result voltage occur due to errors in a charge/discharge device or a voltage sensor.

The present disclosure provides a battery management device, a battery management method, and a battery charge and discharge system that is capable of distinguishing between true defects and false defects in a charge and discharge test for a battery.

FIG. 1 illustrates elements of a battery charge and discharge system according to an embodiment of the present disclosure.

Referring to FIG. 1, the battery charge and discharge system 100 may include a charge/discharge device 110, a battery 120, and a battery management device 130. However, without being limited thereto, some components may be excluded from the battery charge and discharge system 100, or other general-purpose components may be further included in the battery charge and discharge system 100.

In the battery charge and discharge system 100, during the period where the charge and discharge test voltages are applied to the battery 120 by the charge/discharge device 110, the battery management device 130 may measure the voltage from the battery 120 and correct the effects of errors existing in a voltage measurement value. According to an embodiment, the errors present in the voltage measurement value may include an error present in the test voltage generated by the charge/discharge device 110 and/or an error occurring when the sensor of the battery management device 130 measures the voltage of the battery 120.

The charge/discharge device 110 may be configured to apply a charge and discharge test voltages and/or test current to the battery 120. For example, the charge/discharge device 110 may include a power supply device capable of generating various types of voltage or current. The battery 120 may include a secondary battery that is repeatedly recharged and discharged. For example, the battery 120 may include a battery cell, a battery module including a plurality of battery cells, a battery pack including a plurality of battery modules, a battery rack including a plurality of battery packs, or a combination thereof.

The battery management device 130 may execute various management functions for the battery 120. For example, management functions for the battery 120 may include measuring battery states including voltage, current, and/or temperature, estimating battery indicators such as state of charge (SOC) and state of health (SOH), communicating with an external device outside the battery 120, and controlling a charge and discharge of the battery 120. According to an embodiment, the battery management device 130 may execute a correction function for voltage measurement values measured during a charge and discharge test.

According to an embodiment, functions executed by the battery management device 130 may be executed by an energy management server (not illustrated) disposed outside the battery management device 130. For example, the battery management device 130 may transmit data required to execute various management functions to the energy management server through wired/wireless data communication, and receive data obtained as a result of executing the management functions from the energy management server. According to an embodiment, the battery management device 130 may be installed with energy management software to execute management functions through an energy management server, and receive update information of the energy management software from the energy management server.

The voltage measurement values of the battery 120 that have been measured during the charge and discharge test may include values outside a normal range, and such abnormal values may be caused by defects in the battery 120 or may occur in the process of generating the voltage measurement values of the battery 120 regardless of the defects in the battery 120. In order to distinguish between the defects in the two cases, the battery charge and discharge system 100 may analyze the voltage measurement values to correct errors unrelated to the defects in the battery 120. Therefore, it is possible to secure more accurate test data through the battery charge and discharge system 100.

Figure 2:
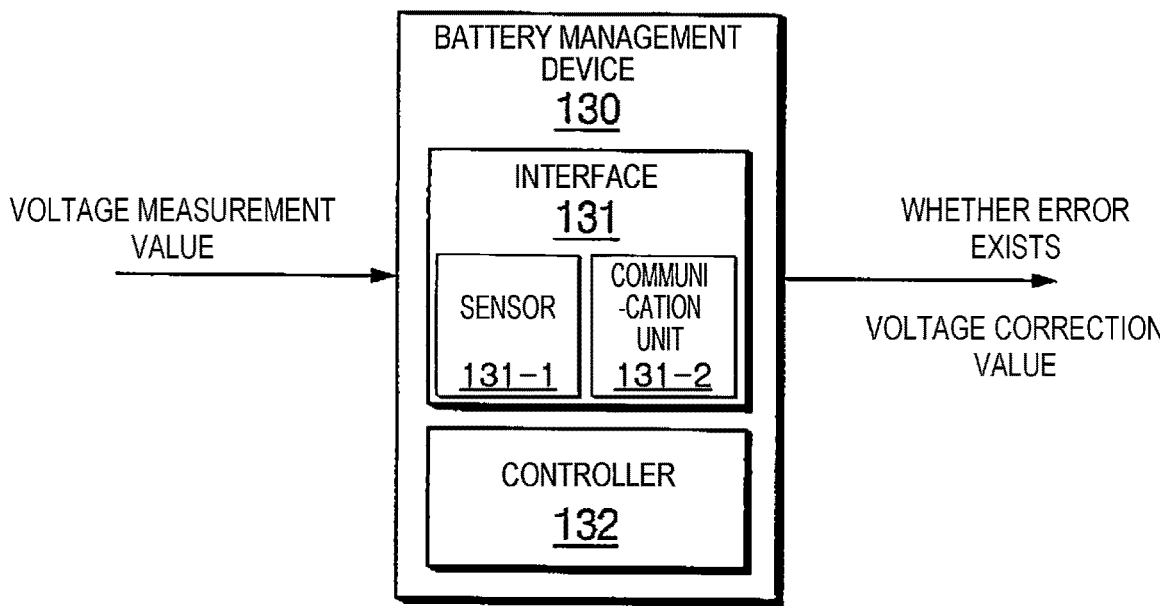
FIG. 2 is a view illustrating elements of a battery management device according to the embodiment.

FIG. 2 illustrates elements of the battery management device 130 in the battery charge and discharge system 100 according to the embodiment.

Referring to FIG. 2, the battery management device 130 may include an interface 131 and a controller 132. However, without being limited thereto, some components may be omitted from the battery management device 130, and other general-purpose components may be further included in the battery management device 130.

The interface 131 may be configured to obtain battery data such as voltage measurement values. The interface 131 may include a sensor 131-1 and/or a communication unit 131-2. When the battery management device 130 includes an on-board battery management system (BMS) configured together with the battery 120, the interface 131 may measure battery data directly from the battery 120 using the sensor 131-1. When the battery management device 130 includes an off-board external device configured remotely from the battery 120, the interface 131 may receive battery data via the communication unit 131-2. For example, the off-board external device may include, for example, a battery charger and a battery management server that communicate with the communication unit 131-2 of the interface 131 with wire and/or wirelessly. Hereinbelow, the case of directly measuring battery data using the sensor 131-1 in the on-board BMS may be described, but the equivalent technical idea may also be applied to the case where battery data is indirectly provided from the off-board external device via the communication unit 131-2.

A voltage measurement value may be generated, and a voltage correction value may be derived using the sensor 131-1 and the controller 132 included in the interface 131 of the battery management device 130. According to an embodiment, in the battery management device 130, the sensor 131-1 and the controller 132 may be electrically connected with each other, for example, via an inter-device communication method such as a bus, general purpose input and output (GPIO), serial peripheral interface (SPI), and mobile industry processor interface (MIPI).

The sensor 131-1 included in the interface 131 of the battery management device 130 may have a structure for measuring voltage, current, temperature, or other battery variables of the battery 120. For example, the sensor 131-1 may include a voltmeter, an ammeter, and/or a thermometer, and may further include other types of sensor devices. According to an embodiment, the sensor 131-1 may be configured to monitor each battery cell of the battery 120, each battery module of the battery 120, or monitor the entire battery pack of the battery 120.

The controller 132 may have a structure for executing instructions that implement the operations of the battery management device 130. The controller 132 may be implemented as an array of multiple logic gates or a general-purpose microprocessor for processing various operations, and may be configured with a single processor or a plurality of processors. For example, the controller 132 may be implemented in the form of at least one of a microprocessor, a CPU, a GPU, and an AP.

The controller 132 may be configured either separately or integrally along with memory and/or a storage configured to temporarily store data or instructions, and may process various operations by executing the instructions stored in the memory and/or storage. The memory and/or storage may store, for example, various data, instructions, mobile applications, and computer programs. For example, the memory and/or storage may be implemented with a non-volatile device such as ROM, PROM, EPROM, EEPROM, flash memory, PRAM, MRAM, RRAM, or FRAM, or a volatile device such as DRAM, SRAM, SDRAM, PRAM, RRAM, or the like FeRAM, and may be implemented in the form of, for example, HDD, SSD, SD, Micro-SD, or a combination thereof.

The sensor 131-1 included in the interface 131 of the battery management device 130 may be configured to, for example, measure voltage from the battery 120 and generate voltage measurement values. The charge/discharge device 110 may apply a test voltage and/or test current to the battery 120 during a charge and discharge test, and voltage measurement values may be measured from the battery 120 during the charge and discharge test. For example, during a charge and discharge test, voltage values may be measured at intervals of 0.1 seconds, 0.5 seconds, 1 second, 2 seconds, 3 seconds, 5 seconds, 10 seconds, 12 seconds, 15 seconds, and other values, and the corresponding values may constitute voltage measurement values. According to an embodiment, the sensor 131-1 included in the interface 131 of the battery management device 130 may measure the voltage from the battery 120 while the charge and discharge test is conducted on the battery 120.

The controller 132 of the battery management device 130 may be configured to derive an average rate of change of voltage measurement values during a first time period. For example, the first time period may be a time period of 100 seconds, and the voltage measurement values may be measured once per second and include 100 values. In this case, the average rate of change of voltage measurement values during the first time period may be calculated by dividing the difference between the last hundredth voltage value and the first voltage value by 100 seconds.

The controller 132 of the battery management device 130 may be configured to: compare the voltage measurement values with corresponding values according to the average rate of change (Slopes); and provide voltage difference values during the first time period ($\Delta$_V_Slopes). For example, in a graph showing voltage fluctuations over time, the trajectory represented by the voltage measurement values may differ from the straight line represented by the average rate of change, and the difference between the voltage measurement value and the value corresponding to the average rate of change at each measurement point may be calculated. For more details about the voltage difference values, FIGS. 5 to 10, which will be described below, may be referred to.

The controller 132 of the battery management device 130 may be configured to determine whether errors exist in the voltage measurement values during the first time period based on the voltage difference values (Δ_V_Slopes). According to the embodiment, the controller 132 may be further configured to derive voltage correction values during the first time period by correcting the voltage measurement values based on the voltage difference values (Δ_V_Slopes).

According to an embodiment, the pattern of voltage difference values that occur due to the internal defects of the battery 120 may be different from the pattern of voltage difference values that occur for reasons unrelated to the defects of the battery 120. Taking this into consideration, the errors occurring in voltage measurement values by the charge/discharge device 110 or the sensor 131-1 may be corrected based on the pattern of voltage difference values.

According to an embodiment, the controller 132 of the battery management device 130 may be configured to: determine whether a first error occurs in the process of generating voltage measurement values based on voltage difference values; and correct the voltage measurement values based on the presence or absence of defects in the equipment stage such as the charge/discharge device 110 or the sensor 131-1. As will be described below, the first error that occurs in the process of generating the voltage measurement values may be different from a second error in the voltage measurement values that occurs due to an internal defect of the battery 110. According to an embodiment, since the first error shows certain characteristics in terms of the measurement values and/or the period of time the error lasts, detection and correction of the first error may be performed by taking these into account.

According to an embodiment, the first error may include an error occurring in the charge/discharge device 110 that charges or discharges a battery 120 for a charge and discharge test and an error occurring in the process in which the sensor 131-1 measures the voltage of the battery 120. According to an embodiment, the first error may be unrelated to a defect caused by, for example, an internal short circuit or disconnection of the battery 120, and may include, for example, an error occurring in the test voltage of the charge/discharge device 110 or a measurement error of the sensor 131-1. According to an embodiment, the first error may further include an error occurring by another configuration of the battery charge and discharge system 100 regardless of a defect in the battery 120 itself.

According to an embodiment, the controller 132 of the battery management device 130 may be configured to determine the signs of the voltage difference values, whether the voltage difference values exceed a threshold difference value, and whether a first error exists based on whether the voltage difference values recover to a range where the voltage difference values do not exceed the threshold difference value within a second time period after exceeding the threshold difference value. For example, when a voltage measurement value is greater than the corresponding value according to an average rate of change, the sign of the voltage difference value may be positive, and when a voltage measurement value is smaller than the corresponding value according to an average change rate, the sign of the voltage difference value may be negative. In addition, the facts whether the voltage difference value exceeds a threshold difference value and whether the voltage difference value that exceeds the threshold difference value recovers to around an average rate of change may be considered as a pattern for determining the first error.

According to an embodiment, the controller 132 of the battery management device 130 may be configured to determine that the first error exists when the signs of voltage difference values are negative, the voltage difference values exceed a threshold difference value, and the voltage difference values recover within the second time period. The fact that the signs of voltage difference values are negative may indicate that the voltage measurement values are larger than the corresponding value according to the average rate of change. At this time, when the voltage difference values exceeding the threshold difference value recover to around the average rate of change within the second time period, the pattern may be interpreted as indicating that, due to a factor other than the battery 120, a first error, for example, an error at an equipment stage, such as the charge/discharge device 110 or the sensor 131-1, has occurred. According to an embodiment, the first error may be determined in a similar manner as well when the signs of the voltage difference values are positive.

According to an embodiment, when the voltage difference values include both positive and negative signs and the voltage difference values exceed a threshold difference value, the controller 132 of the battery management device 130 may be configured to determine that there is a second error that occurs due to a defect in the battery 120. The fact that the voltage difference values include both the positive and negative signs may indicate that voltage measurement values exist both above and below a straight line representing an average rate of change on a graph, and may, therefore, indicate that the range of variation in voltage measurement values is large. This may be interpreted as the second error pattern in which a defect such as a short circuit or disconnection occurs inside the battery 120.

According to an embodiment, when the voltage difference values exceed a threshold difference value and the voltage difference values do not recover within the second time period, the controller 132 of the battery management device 130 may be configured to determine that the battery 120 is in a normal charge and discharge state in which not only the first error but also the second error occurring due to a defect in the battery 120 does not exist. In the meantime, when the voltage difference values exceed a threshold difference value but recover within the second time period, as described above, this may be classified as the first error such as, for example, a defect at an equipment stage such as the charge/discharge device 110 or the sensor 131-1.

According to an embodiment, the first time period is 100 seconds, the second time period is 1 second, and the threshold difference value may be 1 mV (0.001 V). That is, the process of determining whether an error exists in the voltage measurement values and correcting the error may be executed using a period of 100 seconds as one unit. Meanwhile, the second time period that is the reference period of time for recovery of an abnormal voltage in the process of determining the first error and/or the second error may be set to 1 second, and the threshold difference that is the reference for determining whether it is an abnormal voltage may be set to 1 mV (0.001 V).

According to the embodiment, the numerical values of the first time period, the second time period, and the threshold difference values may be set differently depending on various factors such as the type of the charge/discharge device 110, the type of the charge and discharge test, the type of test voltage, the voltage specification, capacity, structure, and characteristics of the battery 120, and the type of the sensor 131-1. For example, the first time period may be set to, for example, 5 seconds, 10 seconds, 15 seconds, 20 seconds, 30 seconds, 60 seconds, 90 seconds, 120 seconds, 150 seconds, 200 seconds, or 300 seconds, the second time period may be set to, for example, 0.1 seconds, 0.2 seconds, 0.3 seconds, 0.5 seconds, 1.2 seconds, 1.5 seconds, 2.0 seconds, 2.5 seconds, or 3.0 seconds, and the threshold difference value may be set to, for example, 0.1 mV, 0.2 mV, 0.3 mV, 0.5 mV, 1.2 mV, 1.5 mV, 2.0 mV, 2.5 mV, or 3.0 mV.

Figure 3:
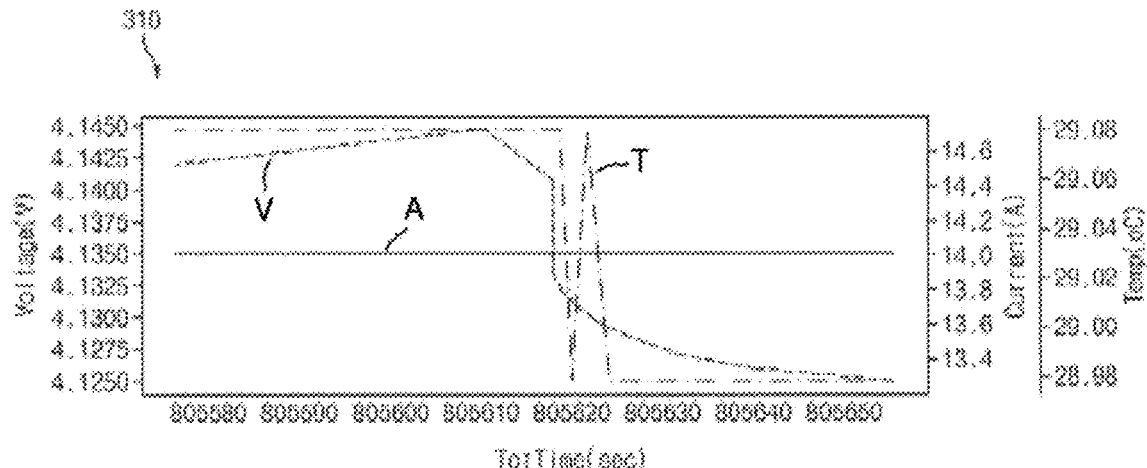
FIG. 3 is a view illustrating graphs showing situations in which a first error, which occurs in the process of generating voltage measurement values according to the embodiment, does not exist.
Figure 3:
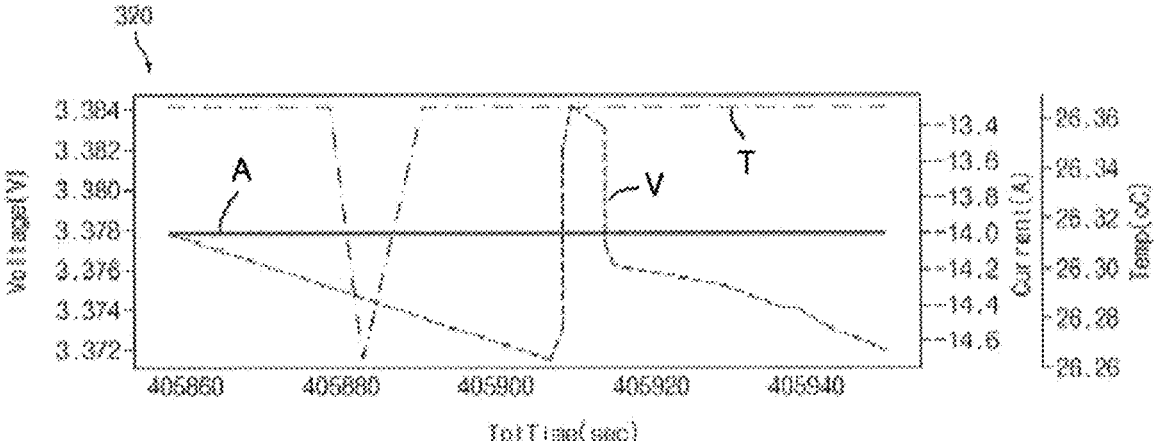
Figure 3:
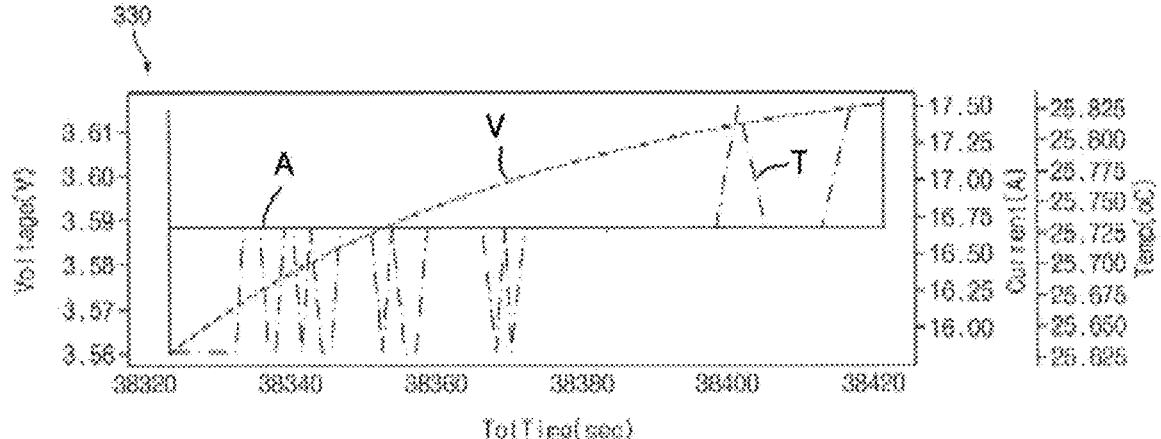

FIG. 3 is a view illustrating graphs 310, 320, and 330 representing situations in which the first error occurring in the process of generating voltage measurement values according to an embodiment does not exist.

In FIG. 3, graphs 310, 320, and 330 illustrate changes in voltage (V), current (A), and temperature (° C.) on the vertical axis according to time (sec) on the horizontal axis.

The current value in graph 310 is a positive number of about 14.0 A. Therefore, graph 310 may be said to represent the situation in which the battery 120 is being charged. In graph 310, it may be said that the voltage increases over time from around 4.1417 V at around 805580 seconds, then decreases significantly at around 805620 seconds, and then reaches a constant value at around 4.1250 V. It can be seen that the distribution of such voltage measurement values represents the second error situation in which a defect occurs in the battery 120 during charging.

The current value in graph 320 is a negative number of about −14.0 A. Therefore, graph 320 may be said to mean the situation in which the battery 120 is being discharged. In graph 320, the voltage decreases over time from about 3.3787 V at around 405860 seconds, repeats large increases and decreases at around 405900 seconds, and then decreases again at a constant rate. According to the distribution of such voltage measurement values, it can be seen that this situation does not include the first error and represents the second error situation in which a defect occurs in the battery 120 during discharge.

The current value in graph 330 is a positive number of about 16.7 A. Therefore, graph 330 may be said to represent the situation in which the battery 120 is being charged. In graph 330, the voltage continues to increase over time from about 3.56 V at around 38320 seconds. According to the distribution of such voltage measurement values, it may be determined that neither the first error nor the second error has occurred.

Among the graphs in FIG. 3, the graphs indicated by reference numerals 310 and 320 represent the situation in which the first error, which is an equipment-stage error, does not occur, but the second error, which is an error in the battery 120, occurs, and the graph indicated by reference numeral 330 illustrates the situation in which neither the first error, which is an equipment-stage error, nor the second error, which is a battery 120 error, occurs.

Figure 4:
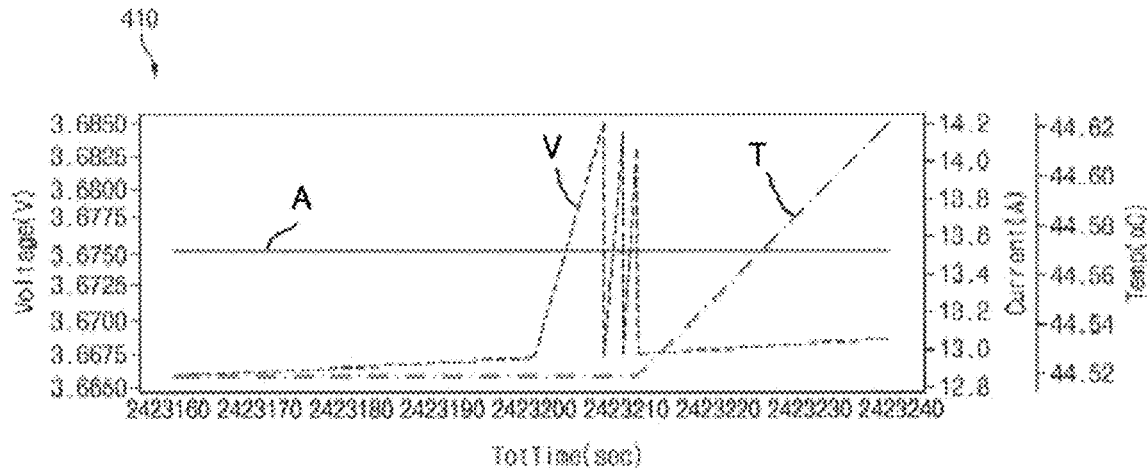
FIG. 4 is a view illustrating graphs each showing the situation in which a first error, which occurs in the process of generating voltage measurement values according to the embodiment, exists.
Figure 4:
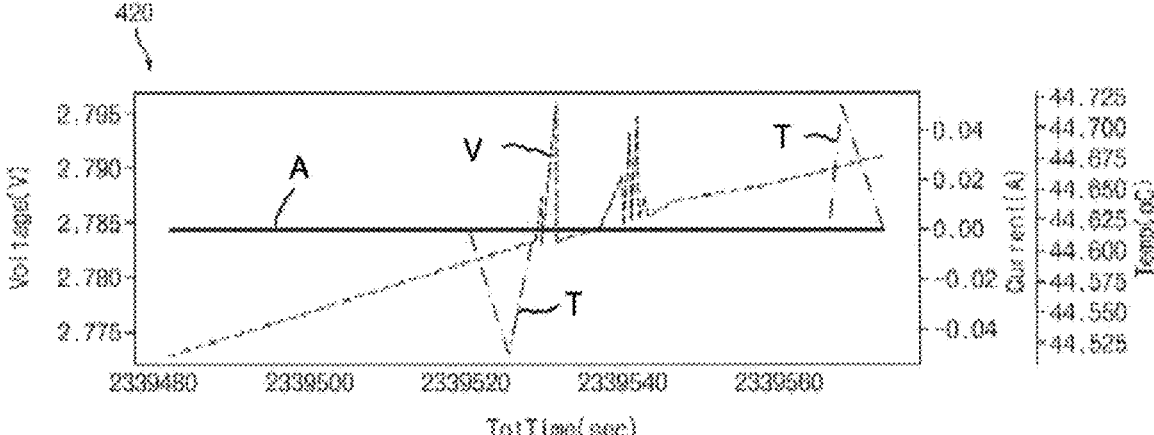
Figure 4:
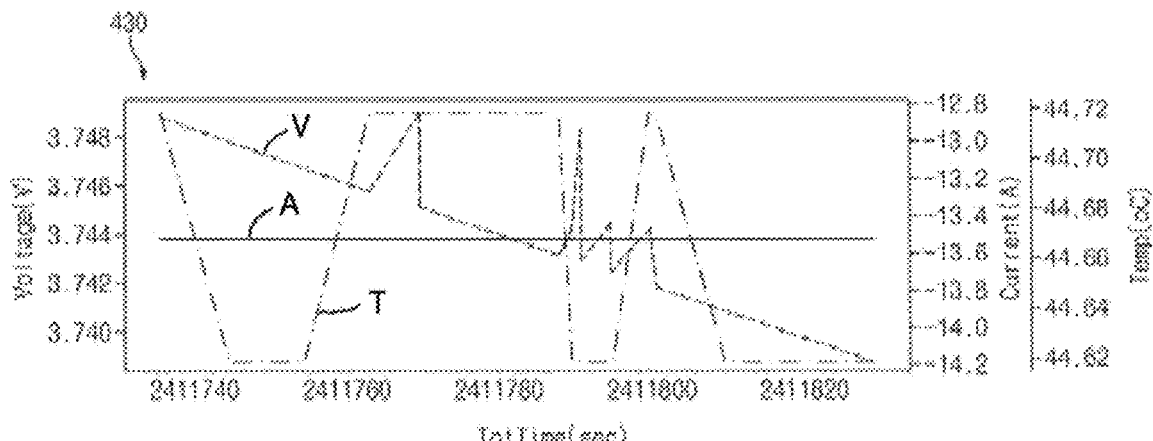

FIG. 4 illustrates graphs 410, 420, and 430 each illustrating the situation in which a first error, which occurs in the process of generating voltage measurement values according to an embodiment, exists.

In FIG. 4, graphs 410, 420, and 430 illustrate changes in voltage (V), current (A), and temperature (° C.) on the vertical axis according to time (sec) on the horizontal axis.

The current value in graph 410 is a positive number of about 13.55 A. Therefore, graph 410 may be said to represent the situation in which the battery 120 is being charged.

In graph 410, the voltage increases over time from about 3.6650 V at around 2423160 seconds, then repeats large increases and decreases starting at around 2423200 seconds, and then recovers to a value according to the existing increase rate. The distribution of such voltage measurement values may be determined as a pattern representing the situation in which a first error occurs in the process of generating voltage measurement values, regardless of a defect in the battery 120.

The value of the current in graph 420 is 0 V, and thus graph 420 may be said to represent the situation in which the battery 120 is in a rest state. Graph 420 illustrates that the voltage increases from about 2.7721 V at around 2339480 seconds, increases significantly after about 2339520 seconds, and then recovers. This distribution of the voltage measurement values represents the situation in which the first error occurs.

The current value in graph 430 is a negative number of about −13.5 A. Therefore, graph 430 may be said to represent the situation in which the battery 120 is being discharged. In graph 430, the voltage decreases over time from about 3.7497 V at around 2411740 seconds, then increases significantly at around 2411760 seconds, and then recovers to a value according to the existing increase rate. The distribution of voltage measurement values represents the situation in which the first error occurs.

Figure 5:
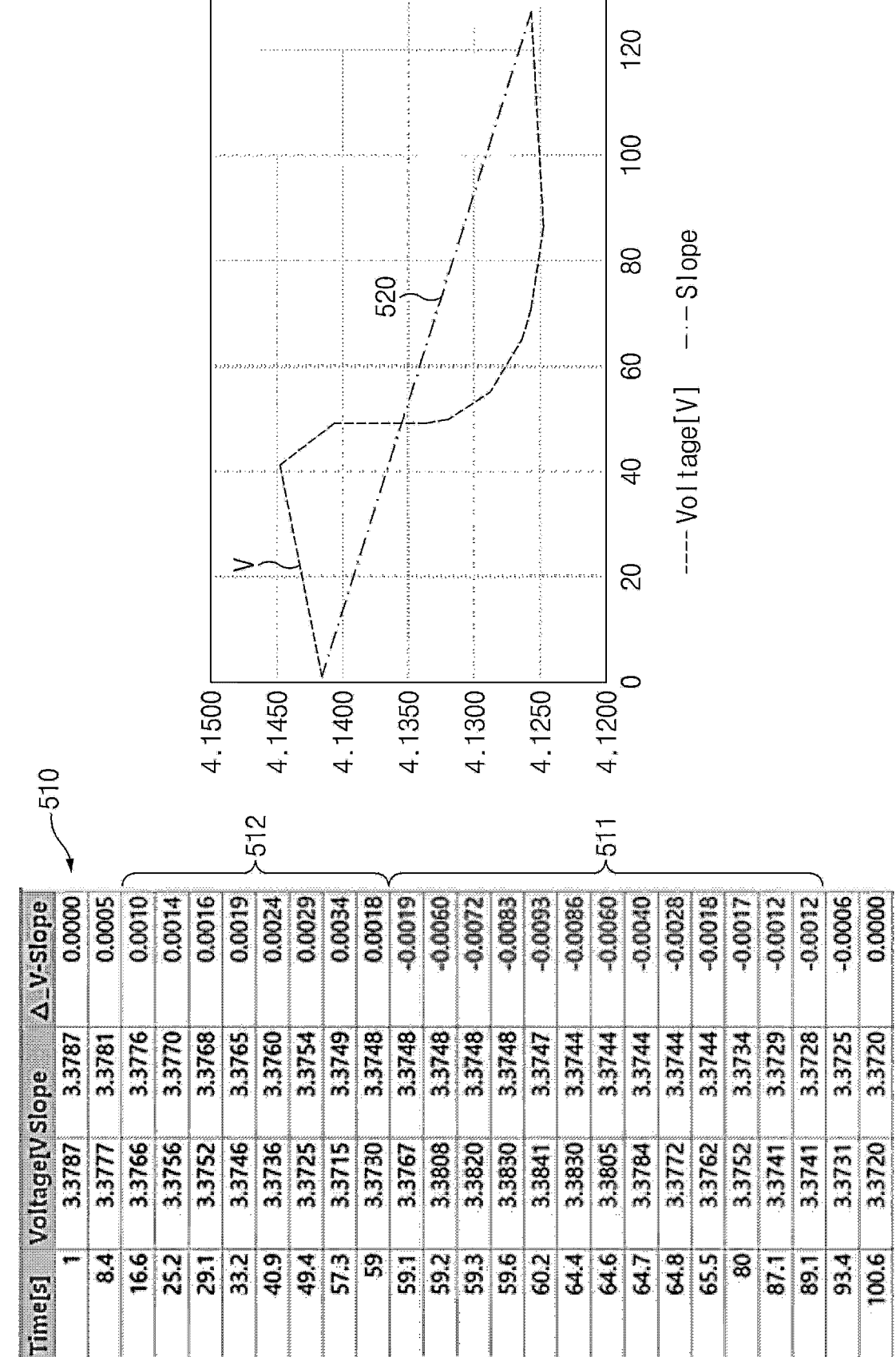
FIGS. 5 to 7 are views each illustrating a process of determining that the first error has not occurred based on voltage measurement values according to the embodiment.
Figure 6:
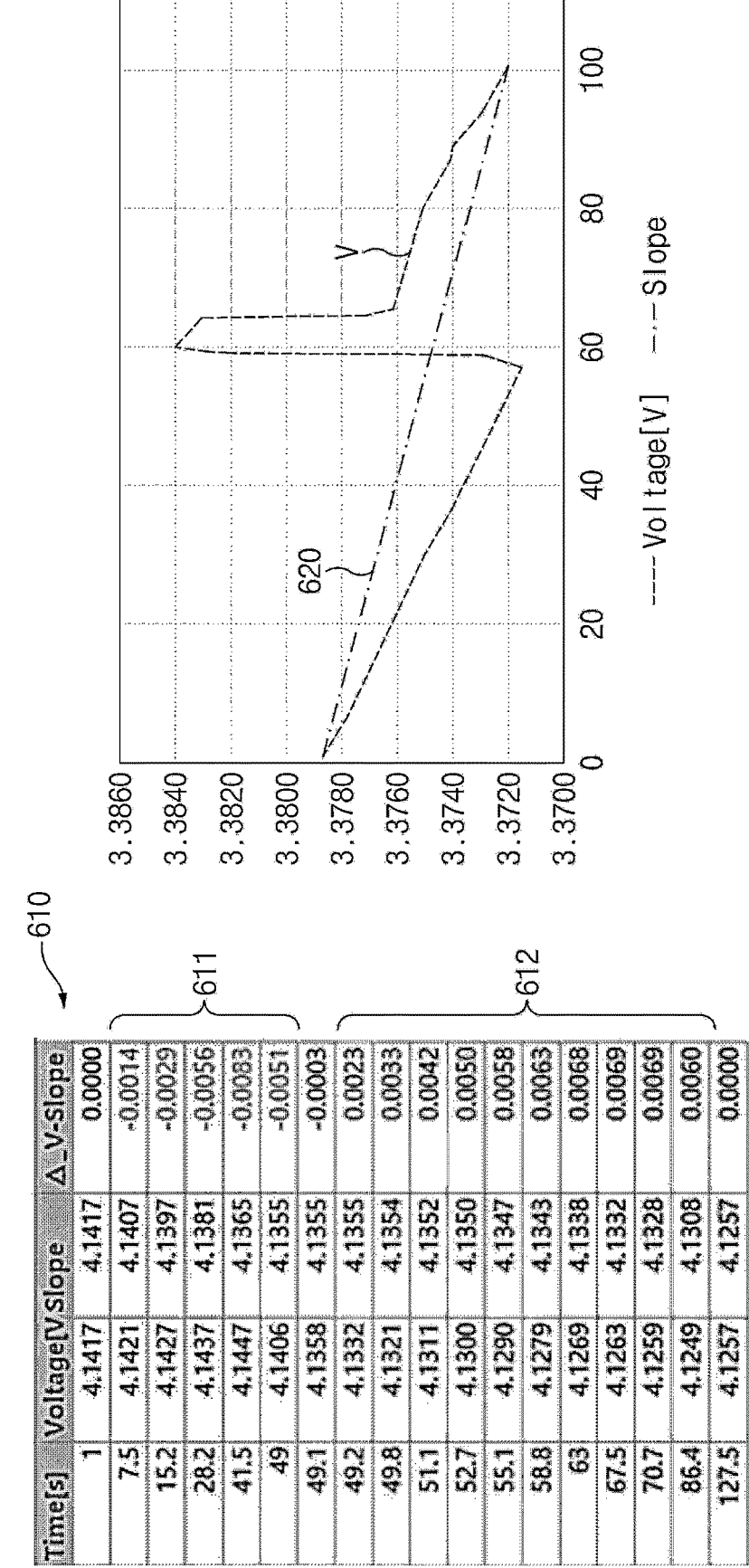
Figure 7:
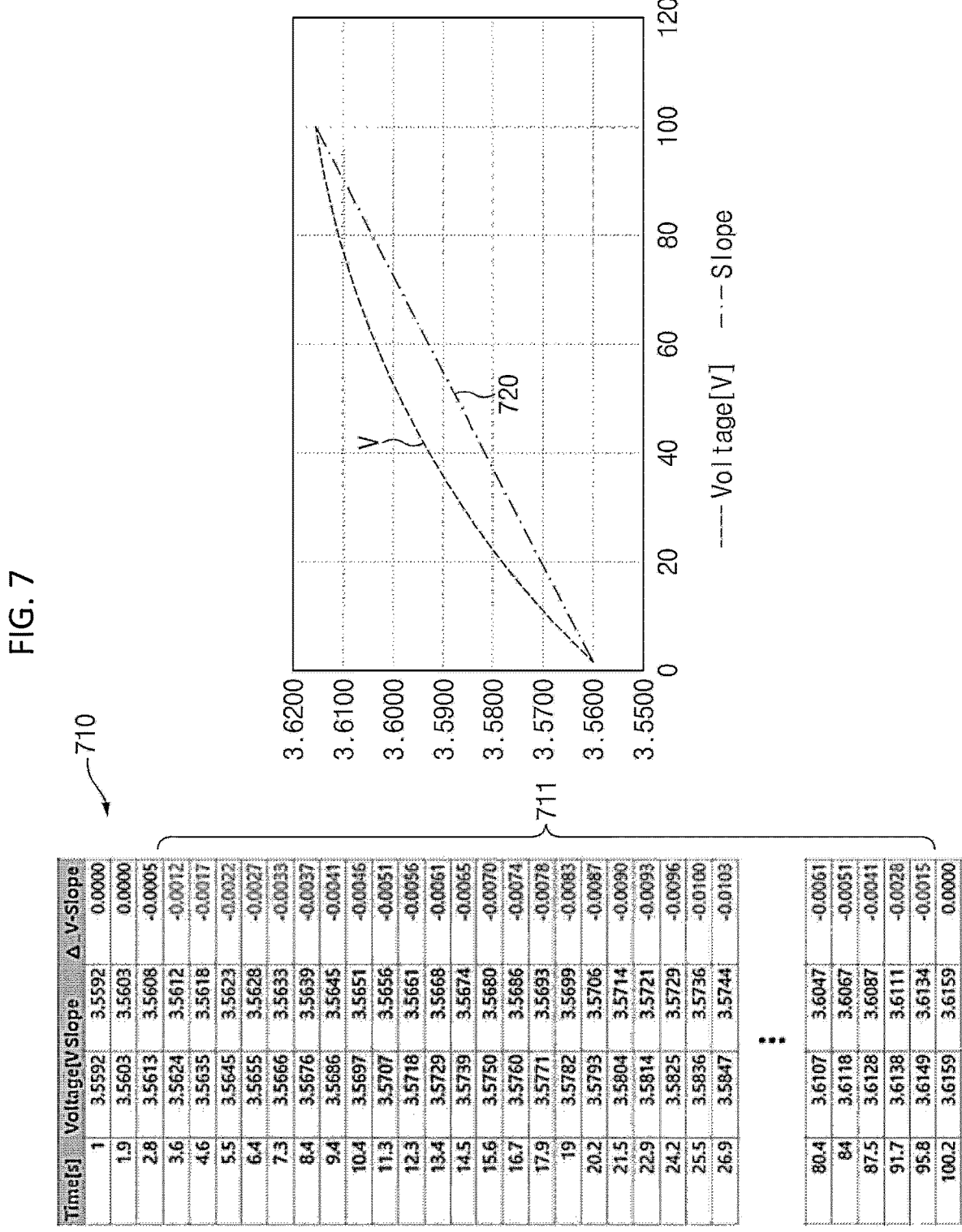

FIGS. 5 to 7 are views each illustrating a process of determining that the first error has not occurred based on voltage measurement values according to an embodiment.

FIG. 5 illustrates table 510 illustrating the voltage measurement values of graph 310 of FIG. 3 along with graph 520 illustrating the average rate of change of the voltage measurement values of table 510. FIG. 6 illustrates table 610 illustrating the voltage measurement values of graph 320 of FIG. 3 along with graph 620 illustrating the average rate of change of the voltage measurement values of table 610. FIG. 7 illustrates table 710 illustrating the voltage measurement values of graph 330 of FIG. 3 along with graph 820 illustrating the average rate of change of the voltage measurement values of table 710.

Table 510 may include a first section 511 in which the voltage difference values in the positive direction exceeds the threshold difference value and a second section 512 in which the voltage difference values in the negative direction exceed the threshold difference value. Here, according to an embodiment, the threshold difference value is 1 mV (0.001 V). Graph 520 represents that the voltage measurement values in the first section 511 are greater than the corresponding values according to the average rate of change, and in the second section 512, the voltage measurement values are smaller than the corresponding values according to the average rate of change. Since the voltage pattern of graph 520 corresponds to the case where the signs of the voltage difference values include both positive and negative signs, and the voltage difference values exceed the threshold difference value (e.g., 1 mV), it may be interpreted as the situation in which the first error does not occur but the second error occurs.

In a similar manner to table 510, table 610 includes a first section 611 in which the voltage difference values in the positive direction exceeds the threshold difference value and a second section 612 in which the voltage difference values in the negative direction exceeds the threshold difference value, and graph 620 represents the situation in which voltage measurement values fluctuate significantly above and below the average rate of change. Since the voltage pattern of graph 620 corresponds to the case where the signs of the voltage difference values include both the positive and negative signs, and the voltage difference values exceed the threshold difference value (e.g., 1 mV), it may be interpreted as the situation in which the first error does not occur but the second error occurs.

Unlike table 510 and table 610, table 710 includes a first section 711 in which the voltage difference values in the positive direction exceed the threshold difference value (e.g., 1 mV), but does not include the excess section in the opposite direction. In particular, it can be seen that the voltage measurement values in table 710 do not recover to a range where the voltage difference values do not exceed the threshold difference within the second time period (e.g., 1 second) after the voltage difference values exceed the threshold difference, which may also be confirmed in graph 720. The voltage pattern of graph 720 may be interpreted as the situation in which neither the first error nor the second error occurs.

Figure 8:
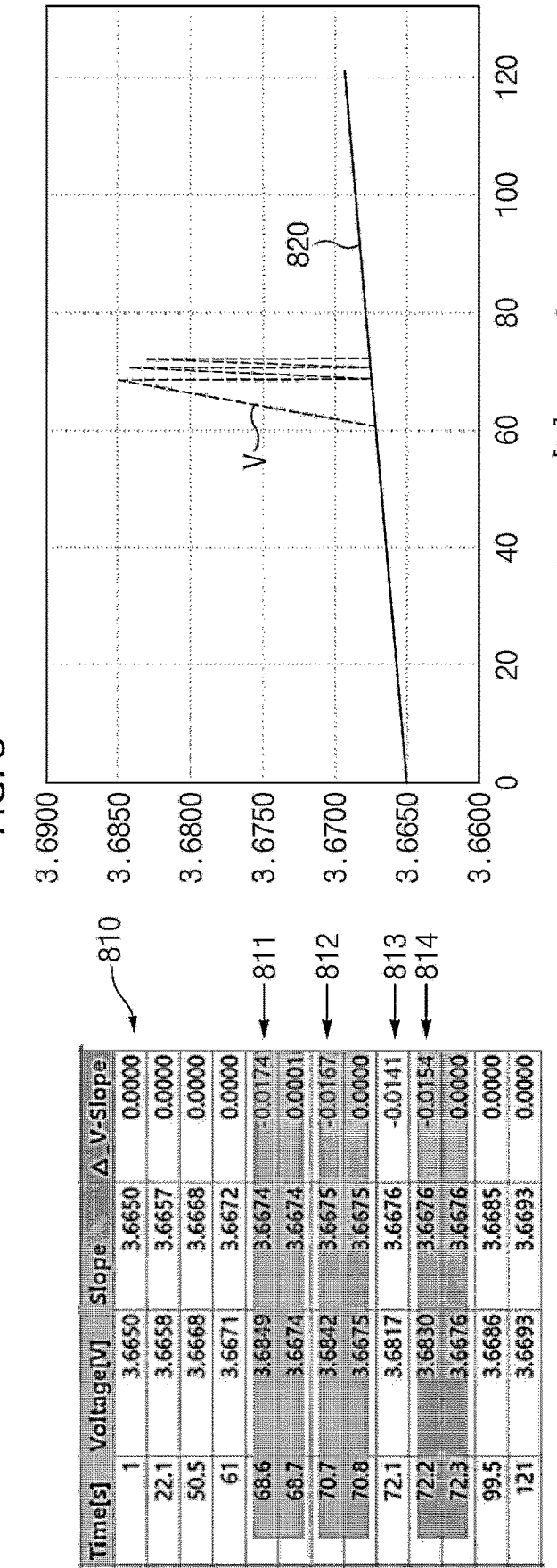
Figure 9:
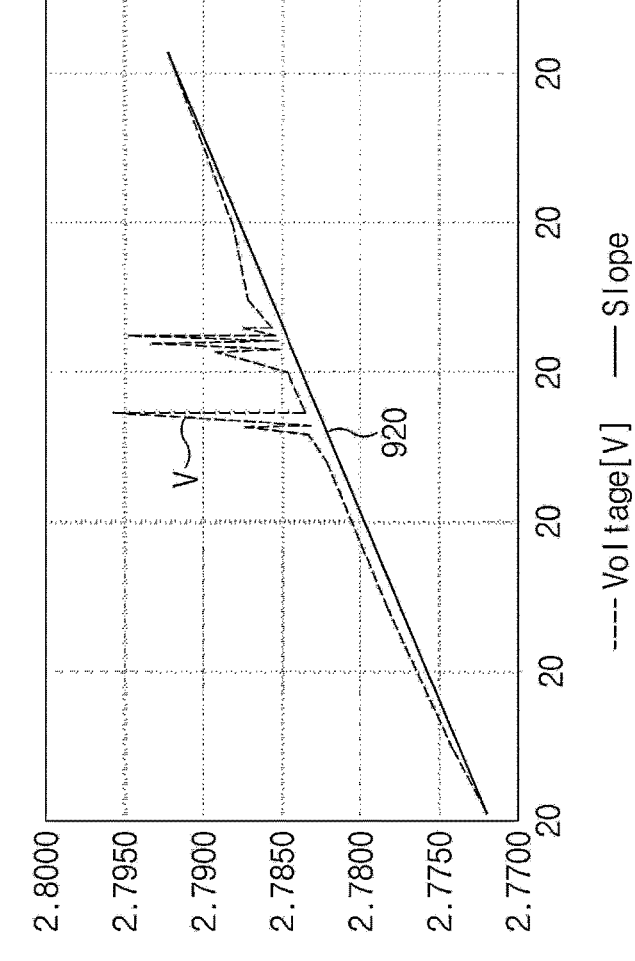

FIGS. 8 to 10 are views each illustrating a process of determining that the first error, which is an equipment-stage error, has occurred based on voltage measurement values according to an embodiment.

FIG. 8 illustrates table 810 illustrating the voltage measurement values of graph 410 of FIG. 4 along with graph 820 illustrating the average rate of change of the voltage measurement values of table 810. FIG. 9 illustrates table 910 illustrating the voltage measurement values of graph 420 of FIG. 4 along with graph 920 illustrating the average rate of change of the voltage measurement values of table 910. FIG. 10 illustrates table 1010 illustrating the voltage measurement values of graph 430 of FIG. 4 along with graph 1020 illustrating the average rate of change of the voltage measurement values of table 1010.

Table 810 includes sections 811, 812, 813, and 814 in which the voltage difference values exceed the threshold difference value. Similarly, table 910 and table 1010 also include sections exceeding the threshold difference value. The sections 811, 812, 813, and 814 of table 810 may be said to correspond to the upwardly spiking portions in graph 820. The threshold exceeding sections 911 to 918 in table 910 and the threshold exceeding sections 1011 to 1017 in table 1010 may also be said to correspond to the spike portions in graph 920 and graph 1020.

However, the voltage distributions of graph 820, graph 920, and graph 1020 all represent the situations in which the voltage difference values exceed the threshold difference value and then recover to the range where the voltage difference values do not exceed the threshold difference value within the second time period (e.g., 1 second). The pattern may be said to indicate that the voltage spikes disappear within a relatively short period of time, that there is no second error related to an internal defect of the battery 120, and that the first error due to the charge/discharge device 110 or the sensor 131-1 has occurred.

Meanwhile, when it is determined through the above-described processes that there is no second error related to an internal defect of the battery 120 and that the first error has occurred due to the charge/discharge device 110 or the sensor 131-1 of the equipment stage, the battery management device 130 corrects the voltage measurement values. According to an embodiment, when it is determined that the first error exists, correction values may be derived by substituting the measured values at respective measurement time points with values represented in a change rate graph at corresponding time points. FIG. 10 illustrates the case where it is determined that the first error exists, in which the measurement value is corrected by replacing 3.7483 V, which is the value measured at 65.6 seconds, with 3.7428 V, which is the value on the change rate graph.

Figure 11:
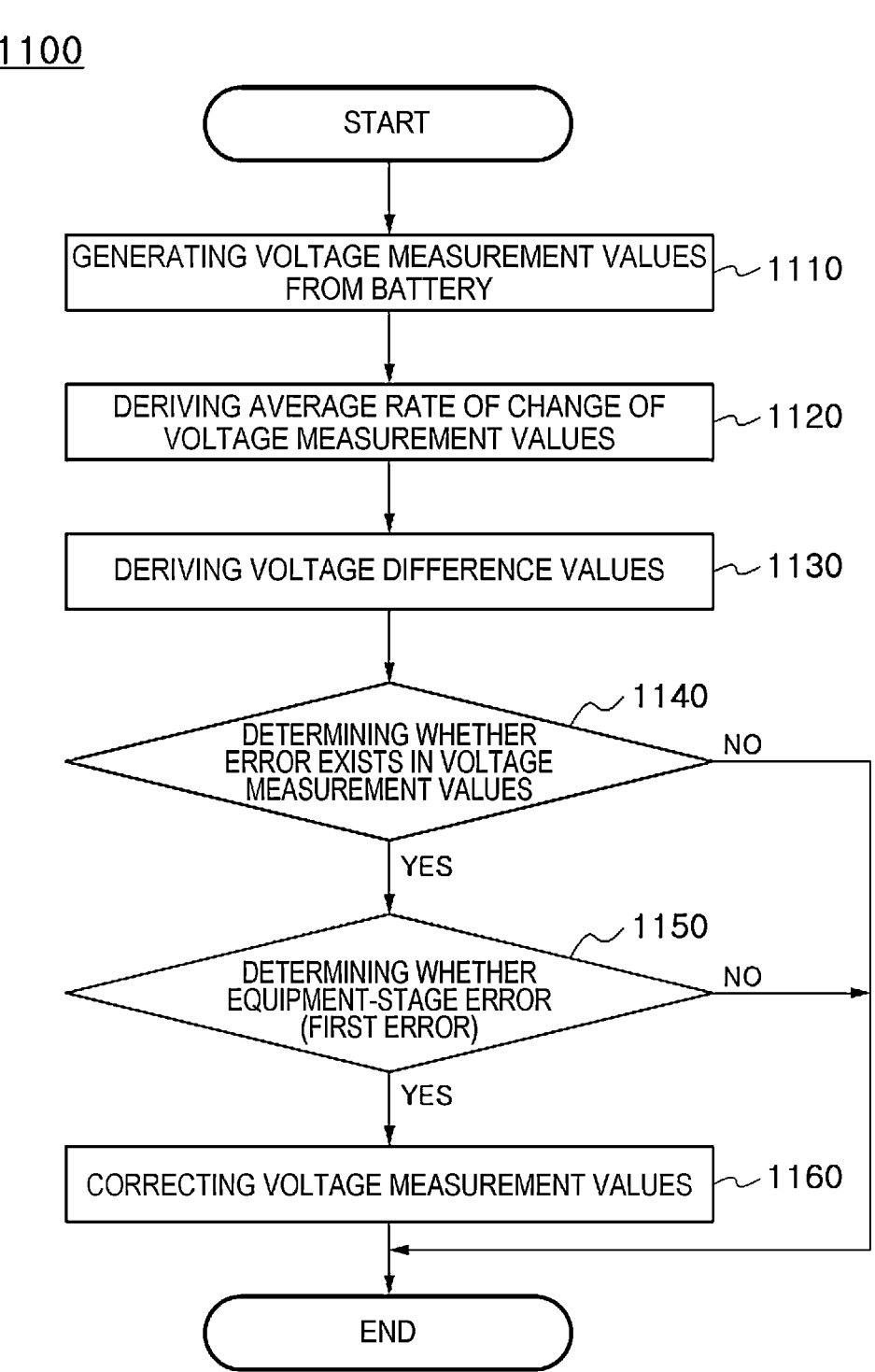
FIG. 11 is a view illustrating a battery management method according to another embodiment.

Referring to FIG. 11, a battery management method 1100 according to an embodiment may include steps 1110 to 1150. However, the battery management method 1100 is not limited to this, and some steps may be omitted or other general-purpose steps may be added, and the steps of the battery management method 1100 may be executed in an order different from the illustrated order.

The battery management method 1100 may include steps processed in time series by the battery management device 130. Therefore, even when the content is omitted below, the content described above with respect to the battery management device 130 is equally applicable to the battery management method 1100.

Steps 1110 to 1160 of the battery management method 1100 may be performed by the sensor 131-1 included in the interface 131 and the controller 132 of the battery management device 130.

In step 1110, the battery management device 130 may generate voltage measurement values by measuring the voltage from the battery 120 at predetermined time points, for example, in a first time period, via the sensor 131-1.

In step 1120, the battery management device 130 may, via the controller 132, derive an average rate of change of voltage measurement values during the first time period. For example, the average rate of change may be calculated by dividing the difference between the last voltage value and the first voltage value measured within a time period (e.g., 100 seconds) by the time period (e.g., 100 seconds), as described above.

In step 1130, via the controller 132, the battery management device 130 may derive voltage difference values during the first time period by comparing voltage measurement values with corresponding values according to the average rate of change.

In step 1140, via the controller 132, the battery management device 130 may determine an abnormal behavior of the voltage measurement values during the first time period based on the voltage difference values, and may determine whether an error exists in the measurement values according to the abnormal behavior.

In step 1150, the battery management device 130 may analyze the type of error and determine whether a first error, which is an equipment-stage error, exists.

In step 1160, when it is determined that the first error exists, the battery management device 130 corrects the voltage management values, and then terminates the process.

When it is determined in step 1140 that there is no error in the voltage measurement values, the battery management device 130 terminates the process without performing additional correction processing.

Meanwhile, the battery management method 1100 may be implemented in the form of a computer program stored in computer-readable storage media. For example, the computer program may include instructions for implementing the battery management method 1100, and the instructions of the program may be stored in computer-readable storage media. The computer program may include a mobile application.

For example, the computer-readable storage media may include magnetic media such as hard disks, floppy disks, and magnetic tapes, optical media such as CD-ROMs and DVDs, magneto-optical media such as floptical disks, and hardware devices specifically configured to store and execute computer program instructions, such as ROM, RAM, and flash memory. Computer program instructions may include machine language codes created by a compiler and high-level language codes that can be executed by a computer using, for example, an interpreter.

The terms such as "include," "comprise," and "have," as used in the foregoing description, indicate that the corresponding component may be included unless specifically stated to the contrary. Therefore, these terms should not be interpreted as excluding other components, but rather as being able to further include other components. All terms, including technical or scientific terms, have the same meaning as generally understood by a person ordinarily skilled in the technical field to which the embodiments disclosed herein belong, unless otherwise defined. Commonly used terms, such as terms defined in dictionaries, should be interpreted as consistent with the contextual meaning of the relevant technology, and should not be interpreted in an idealized or overly formal sense unless explicitly defined herein.

The foregoing descriptions are merely explanations of the technical idea disclosed herein. A person ordinarily skilled in the technical field to which the embodiments disclosed herein belong will be able to make various modifications and variations without departing from the essential characteristics of the embodiments disclosed herein. Accordingly, the embodiments disclosed herein are not intended to limit the technical idea of the embodiments disclosed herein, but rather to explain them, and the scope of the technical idea disclosed herein is not limited by these embodiments. The scope of protection of the technical idea disclosed herein shall be interpreted in accordance with the claims below, and all technical ideas within the scope equivalent to the protection scope shall be interpreted as being included in the scope of rights of the present disclosure.

What is claimed is:

1. A battery management device comprising:
an interface configured to obtain voltage measurement values generated by measuring voltage from a battery at regular time intervals within a first time period; and
a controller configured to:
derive an average rate of change of the voltage measurement values during the first time period;
compare the voltage measurement values with corresponding values according to the average rate of change to derive voltage difference values during the first time period; and
determine whether an error exists in the voltage measurement values during the first time period based on the voltage difference values.

2. The battery management device of claim 1, wherein the controller is further configured to:
derive voltage correction values for the first time period by correcting the voltage measurement values based on the voltage difference values when it is determined that the error exists in the voltage measurement values.

3. The battery management device of claim 2, wherein the controller is further configured to:
determine whether a first error, which occurs in a process of generating the voltage measurement values based on the voltage difference values, exists; and
correct the voltage measurement values based on whether the first error exists.

4. The battery management device of claim 3, wherein the first error includes an error occurring in a charge/discharge device that charges or discharges the battery for a charge and discharge test and an error that occurs in the process of measuring the voltage of the battery to generate the voltage measurement values.

5. The battery management device of claim 3, wherein the controller is further configured to:
determine whether the first error exists based on signs of the voltage difference values, whether the voltage difference values exceed a threshold difference value, and whether the voltage difference values recover to a range where the voltage reference values do not exceed the threshold difference value within a second time period after exceeding the threshold difference value.

6. The battery management device of claim 5, wherein the controller is further configured to:
determine that the first error exists when the voltage difference values have a negative sign, the voltage difference values exceed the threshold difference value, and the voltage difference values recover within the second time period after the first time period.

7. The battery management device of claim 5, wherein the controller is further configured to:
determine that the first error does not exist and a second error, which occurs due to a defect of the battery, exists when the voltage difference values include both positive and negative signs, and the voltage difference values exceed the threshold difference value.

8. The battery management device of claim 5, wherein the controller is further configured to:
determine that neither the first error nor a second error, which occurs due to a defect in the battery, exists when the voltage difference values exceed the threshold difference value and the voltage difference values do not recover within the second time period.

9. A battery management method comprising:
obtaining, via an interface, voltage measurement values generated by measuring voltage from a battery at regular time intervals within a first time period;
deriving, via a controller, an average rate of change of the voltage measurement values during the first time period;
comparing, via the controller, the voltage measurement values with corresponding values according to the average rate of change to derive voltage difference values during the first time period; and
determining, via the controller, whether an error exists in the voltage measurement values during the first time period based on the voltage difference values.

10. The battery management method of claim 9, further comprising:
deriving voltage correction values for the first time period by correcting the voltage measurement values based on the voltage difference values when it is determined via the controller that the error exists in the voltage measurement values.

11. The battery management method of claim 10, wherein the deriving the voltage correction values includes:
determining whether a first error, which occurs in a process of generating the voltage measurement values based on the voltage difference values, exists; and
correcting the voltage measurement values based on whether the first error exists.

12. The battery management method of claim 11, wherein the first error includes an error occurring in a charge/discharge device that charges or discharges the battery for a charge and discharge test, and an error that occurs in the process of measuring the voltage of the battery to generate the voltage measurement values.

13. The battery management method of claim 11, wherein the determining whether the first error exists includes:

determining whether the first error exists based on signs of the voltage difference values, whether the voltage difference values exceed a threshold difference value, and whether the voltage difference values recover to a range where the voltage difference values do not exceed the threshold difference value within a second time period after exceeding the threshold difference value.

14. The battery management method of claim 13, wherein the determining whether the first error exists includes:

determining that the first error exists when the voltage difference values have a negative sign, the voltage difference values exceed the threshold difference value, and the voltage difference values recover within the second time period after the first time period.

15. The battery management method of claim 13, wherein the determining whether the first error exists includes:

determining that the first error does not exist and a second error, which occurs due to a defect of the battery, exists when the voltage difference values include both positive and negative signs, and the voltage difference values exceed the threshold difference value.

16. The battery management method of claim 13, wherein the determining whether the first error exists includes:

determining that neither the first error nor a second error, which occurs due to a defect in the battery, exists when the voltage difference values exceed the threshold difference value and the voltage difference values do not recover within the second time period.

17. A battery charge and discharge system comprising:

a battery;

a charge/discharge device configured to charge or discharge the battery for a charge and discharge test; and a battery management device configured to:

obtain voltage measurement values generated by measuring voltage from the battery during a first time period;

derive an average rate of change of the voltage measurement values during the first time period;

compare the voltage measurement values with corresponding values according to the average rate of change to derive voltage difference values during the first time period; and determine whether an error exists in the voltage measurement values during the first time period based on the voltage difference values.

18. The battery charge and discharge system of claim 17, wherein the battery management device is further configured to:

derive voltage correction values for the first time period by correcting the voltage measurement values based on the voltage difference values when it is determined that the error exists in the voltage measurement values.

19. The battery charge and discharge system of claim 18, wherein the battery management device is further configured to:

determine whether a first error, which occurs in a process of generating the voltage measurement values based on the voltage difference values, exists; and correct the voltage measurement values based on whether the first error exists.

20. The battery charge and discharge system of claim 19, wherein the battery management device is further configured to:

determine whether the first error exists based on signs of the voltage difference values, whether the voltage difference values exceed a threshold difference value, and whether the voltage difference values recover to a range where the voltage difference values do not exceed the threshold difference value within a second time period after exceeding the threshold difference value.

* * * * *